(12) United States Patent
Liu et al.

(10) Patent No.: US 10,852,890 B2
(45) Date of Patent: Dec. 1, 2020

(54) TOUCH PANEL AND MANUFACTURING METHOD THEREOF

(71) Applicant: TPK Touch Solutions Inc., Taipei (TW)

(72) Inventors: Chen-Yu Liu, Taoyuan (TW); Bo-Ren Jian, Taoyuan (TW); Cheng-Ping Liu, Taoyuan (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

(21) Appl. No.: 16/111,162

(22) Filed: Aug. 23, 2018

(65) Prior Publication Data

US 2019/0064968 A1  Feb. 28, 2019

(30) Foreign Application Priority Data

Aug. 31, 2017 (CN) .......................... 2017 1 0779122

(51) Int. Cl.
*H05K 3/02* (2006.01)
*H05K 3/10* (2006.01)
*G06F 3/044* (2006.01)
*H05K 3/18* (2006.01)

(52) U.S. Cl.
CPC .............. *G06F 3/044* (2013.01); *H05K 3/18* (2013.01); *G06F 2203/04103* (2013.01); *G06F 2203/04111* (2013.01); *Y10T 29/49155* (2015.01)

(58) Field of Classification Search
CPC .......... G06F 3/044; G06F 2203/04111; G06F 2203/04103; H05K 3/18; Y10T 29/49128; Y10T 29/49155
USPC ................................................... 29/831, 846
See application file for complete search history.

(56) References Cited

U.S. PATENT DOCUMENTS

| | | | | |
|---|---|---|---|---|
| 9,857,922 | B2 * | 1/2018 | Liu .................. | G06F 3/044 |
| 2010/0243295 | A1 * | 9/2010 | Allemand .............. | B82Y 10/00 174/250 |
| 2015/0138452 | A1 * | 5/2015 | Petcavich ............. | G06F 3/0412 349/12 |

* cited by examiner

Primary Examiner — Donghai D Nguyen
(74) Attorney, Agent, or Firm — Cooper Legal Group, LLC

(57) ABSTRACT

A touch panel includes a substrate, a touch sensing electrode, a peripheral conductive trace, a protective layer, and a conductive layer. The substrate has a display area and a peripheral area. The touch sensing electrode is disposed in the display area. The peripheral conductive trace is disposed in the peripheral area. The touch sensing electrode is electrically connected to the peripheral conductive trace. The touch sensing electrode and the peripheral conductive trace at least include metal nanowires. The protective layer is disposed on the touch sensing electrode, and the conductive layer is disposed on the peripheral conductive trace.

20 Claims, 16 Drawing Sheets

TOUCH PANEL AND MANUFACTURING METHOD THEREOF

CROSS-REFERENCE TO RELATED APPLICATION

This application claims priority to China Application Serial Number 201710779122.9, filed Aug. 31, 2017, which is herein incorporated by reference.

BACKGROUND

Technical Field

The present disclosure relates to a touch panel and a manufacturing method thereof.

Description of Related Art

In recent years, as transparent conductors are light transmissible and at the same time provide good conductivity, transparent conductors find frequent use in many display-related or touch-related devices. Generally speaking, a transparent conductor may be include various metal oxides, such as indium tin oxide (ITO), indium zinc oxide (IZO), cadmium tin oxide (CTO), or aluminum-doped zinc oxide (AZO). Metal oxide thin film layers can be formed by a physical vapor deposition method or a chemical vapor deposition method, then formed into useful patterns by a photolithography process. However, the manufacturing methods for the above metal oxide thin film layers may have problems of high costs, complex processes, and low yields. In some cases, the patterned metal oxide thin film layers are visually apparent to the viewer. As a result, novel transparent conductors are being developed, for example, transparent conductors made of metal nanowires and the like.

However, there are still problems that need to be solved in the nanowire processing technology. For example, nanowires are utilized to fabricate touch sensing electrodes, and there are problems integrating two kinds of materials i.e., the nanowires and the metal peripheral traces in both process and structural aspects. For instance, silver paste is used in a traditional process for fabricating metal traces in peripheral areas, and the metal traces made of silver paste need to climb onto the the touch sensing electrodes to form connection structures. In designing this connection structure, the contact impedance of the connection structure may be taken into consideration. For example, in a traditional method, a thicker resin layer is often applied on the touch sensing electrodes made of nanowires to improve the weatherability. However, the thickness of the resin layer causes a non-conductive gap between the two materials and results in a high contact resistance of the connection structure. As a result, loss or distortion occurs when the circuit including the touch sensing electrodes and the metal traces transmits signals. Further, in wet conditions, due to a direct current (DC) gradient, the metal traces made of silver paste tend to degrade reliability due to the silver migration phenomenon.

Additionally, the metal traces need to be fabricated by a laser etching method after the silver paste is coated in the peripheral area. This process is complex and time-consuming, thus resulting in a higher manufacturing cost and a lower yield. Therefore, it is difficult to mass produce the metal traces.

For the foregoing reasons, there is a need to re-design the process and the electrode structure in accordance with the material properties, so that the products can achieve better performance.

SUMMARY

In some embodiments of the present disclosure, the durability of the touch sensing electrodes in the display area can be improved, and a low impedance conductive circuit is simultaneously formed. In addition, according to some embodiments of the present disclosure, a manufacturing method of a new touch electrode is provided, so that a touch panel structure different from the traditional art is provided.

In some embodiments of the present disclosure, a manufacturing method of a touch panel is provided. The manufacturing method of the touch panel comprises: providing a substrate having a display area and a peripheral area; providing a touch sensing electrode disposed in the display area and a peripheral conductive trace disposed in the peripheral area, providing a protective layer disposed on the touch sensing electrode; and providing a conductive layer disposed on the peripheral conductive trace. The touch sensing electrode is electrically connected to the peripheral conductive trace. The touch sensing electrode and the peripheral conductive trace are formed by patterning a transparent conductive layer at least including metal nanowires.

In some embodiments of the present disclosure, providing a touch sensing electrode disposed in the display area and a peripheral conductive trace disposed in the peripheral area comprises: providing a film layer, wherein the metal nanowires are embedded into the film layer to form a conductive network, the film layer and the metal nanowires integrally form the transparent conductive layer; and removing portions of the metal nanowires to form a non-conductive area in the display area and the peripheral area.

In some embodiments of the present disclosure, the metal nanowires protrude from a surface of the film layer and expose from the surface.

In some embodiments of the present disclosure, the manufacturing method of the touch panel further comprises a pre-processing step to expose the metal nanowires in the peripheral area from a surface of the film layer.

In some embodiments of the present disclosure, a material of the protective layer is the same as or different from a material of the film layer.

In some embodiments of the present disclosure, he film layer comprises a cross-linking agent, a polymerization inhibitor, an antioxidant, a UV stabilizer, a surfactant, a corrosion inhibitor, or a mixture thereof.

In some embodiments of the present disclosure, providing a conductive layer disposed on the peripheral conductive trace by an electro-plating method or an electroless plating method comprises: providing an electro-plating copper layer or an electro-plating cooper layer on the peripheral conductive trace.

In some embodiments of the present disclosure, providing a conductive layer disposed on the peripheral conductive trace by an electro-plating method or an electroless plating method comprises: providing a electroless-plating copper layer on the peripheral conductive trace, and providing an electroless-plating nickel layer on the copper layer.

In some embodiments of the present disclosure, providing a conductive layer disposed on the peripheral conductive trace by an electro-plating method or an electroless plating method comprises: providing the conductive layer having a core-shell structure on the peripheral conductive trace.

In some embodiments of the present disclosure, providing a conductive layer disposed on the peripheral conductive trace by an electro-plating method or an electroless plating method comprises: providing the conductive layer having a Cu core-Ni shell structure on the peripheral conductive trace.

In some embodiments of the present disclosure, the touch panel comprises a substrate, a touch sensing electrode, a peripheral conductive trace, a protective layer, and a conductive layer. The substrate has a display area and a peripheral area. The touch sensing electrode is disposed in the display area. The peripheral conductive trace is disposed in the peripheral area. The touch sensing electrode is electrically connected to the peripheral conductive trace. The touch sensing electrode and the peripheral conductive trace at least include metal nanowires. The protective layer is disposed on the touch sensing electrode, and the conductive layer is disposed on the peripheral conductive trace. The conductive layer is an electroless-plating layer, an electro-plating layer, or a combination thereof.

In some embodiments of the present disclosure, the touch panel further includes a film layer disposed on the substrate. Each of the display area and the peripheral area has a conductive area and a non-conductive area. The metal nanowires are embedded into the film layer in the conductive areas to form a conductive network. The film layer and the metal nanowires in the conductive area of the peripheral area integrally form the peripheral conductive trace, and the film layer and the metal nanowires in the conductive area of the display area integrally form the touch sensing electrode.

In some embodiments of the present disclosure, the metal nanowires protrude from a surface of the film layer.

In some embodiments of the present disclosure, a material of the protective layer is the same as or different from a material of the film layer.

In some embodiments of the present disclosure, the film layer comprises a cross-linking agent, a polymerization inhibitor, an antioxidant, a UV stabilizer, a surfactant, a corrosion inhibitor, or a mixture thereof.

In some embodiments of the present disclosure, the conductive layer is an electroless-plating copper layer.

In some embodiments of the present disclosure, the conductive layer comprises an electroless-plating copper layer, and an electroless-plating nickel layer disposed on the electroless-plating copper layer.

In some embodiments of the present disclosure, the conductive layer has a core-shell structure.

In some embodiments of the present disclosure, the conductive layer has a Cu core-Ni shell structure.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and elements are schematically depicted in order to simplify the drawings.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated. In addition, "film layer", "coating layer", "polymer" and "precursor" shall mean identical or similar elements, the difference therebetween mainly lie in the curing state thereof, and it is noted the terms may be alternatively used below for convenience of illustration.

Figure 1:
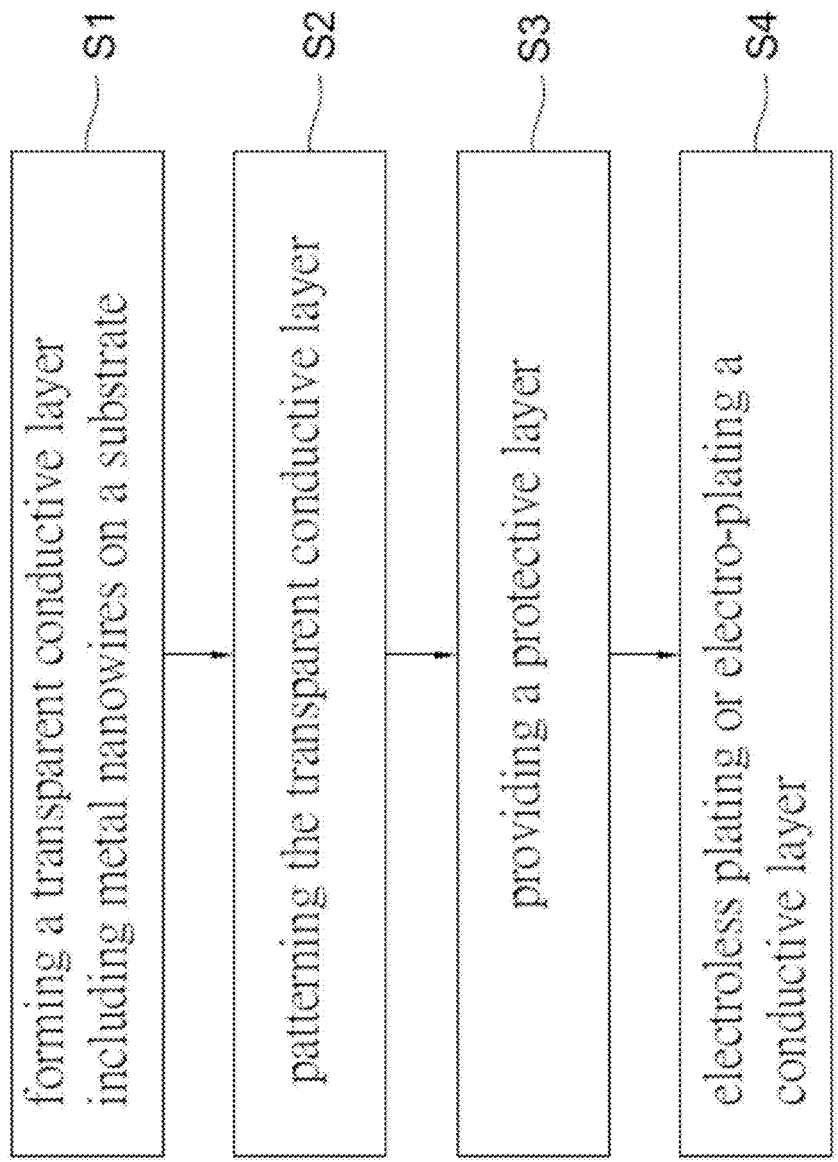
FIG. 1 depicts a flowchart of a manufacturing method of a touch panel according to some embodiments of the present disclosure.
Figure 2:
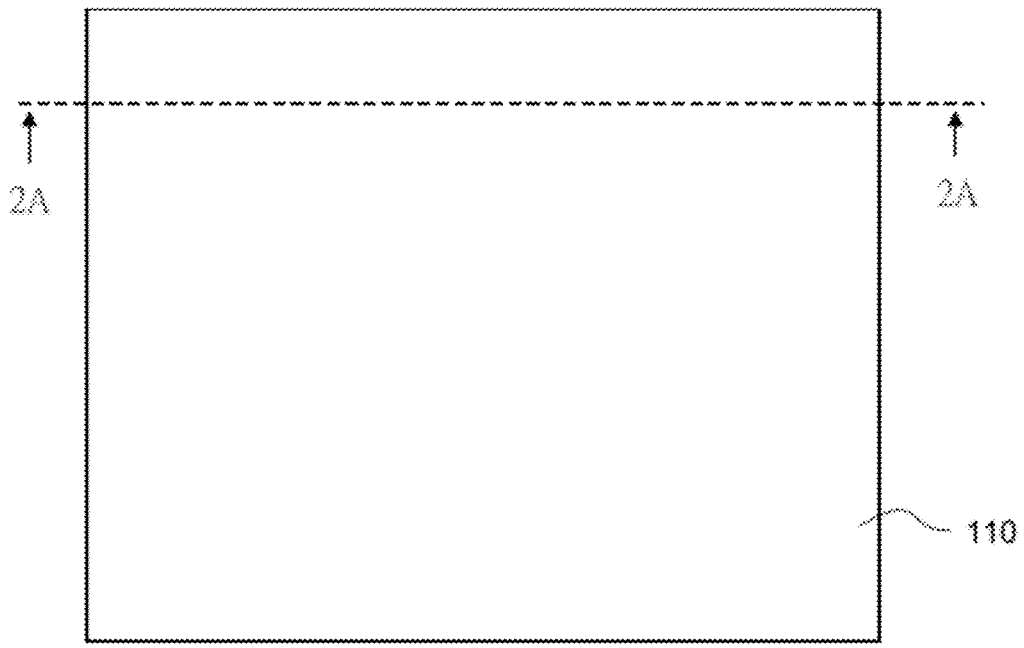
FIG. 2 depicts a top view schematic diagram of a substrate according to some embodiments of the present disclosure.
Figure 2A:
FIG. 2A depicts a cross-sectional schematic diagram taken along line 2A-2A of FIG. 2.

FIG. 1 depicts a flowchart of a manufacturing method 100 of a touch panel according to some embodiments of the present disclosure. FIG. 2 to FIG. 2A, FIG. 3 to FIG. 3A, FIG. 4 to FIG. 4B, FIG. 5 to FIG. 5B, and FIG. 6 to FIG. 6B depict top view schematic diagrams and cross-sectional schematic diagrams of a touch panel at various steps S1 to S4 of the manufacturing method 100. The process according to the present embodiment comprises the following steps: forming a transparent conductive layer including metal nanowires on a substrate; patterning the transparent conductive layer so as to form a touch sensing electrode disposed in the display area and a peripheral conductive trace disposed in the peripheral area; providing a protective layer disposed on the touch sensing electrode; and providing a conductive layer on the peripheral conductive trace by electroless-plating, electro-plating or a combination thereof.

A detailed process according to the present embodiment is as follows. A description is provided with reference to FIG. 2 and FIG. 2A. Firstly, a substrate 110 is provided. According to some embodiments of the present disclosure, the substrate 110 is preferably a transparent substrate. In greater detail, the substrate 110 may be a rigid transparent substrate or a flexible transparent substrate. A material of the substrate 110 may be selected from transparent materials, for example but not limited to, glass, polymethylmethacrylate (PMMA), polyvinyl chloride (PVC), polypropylene (PP), polyethylene terephthalate (PET), polyethylene naphthalate (PEN), polycarbonate (PC), polystyrene (PS), and the like.

Figure 3:
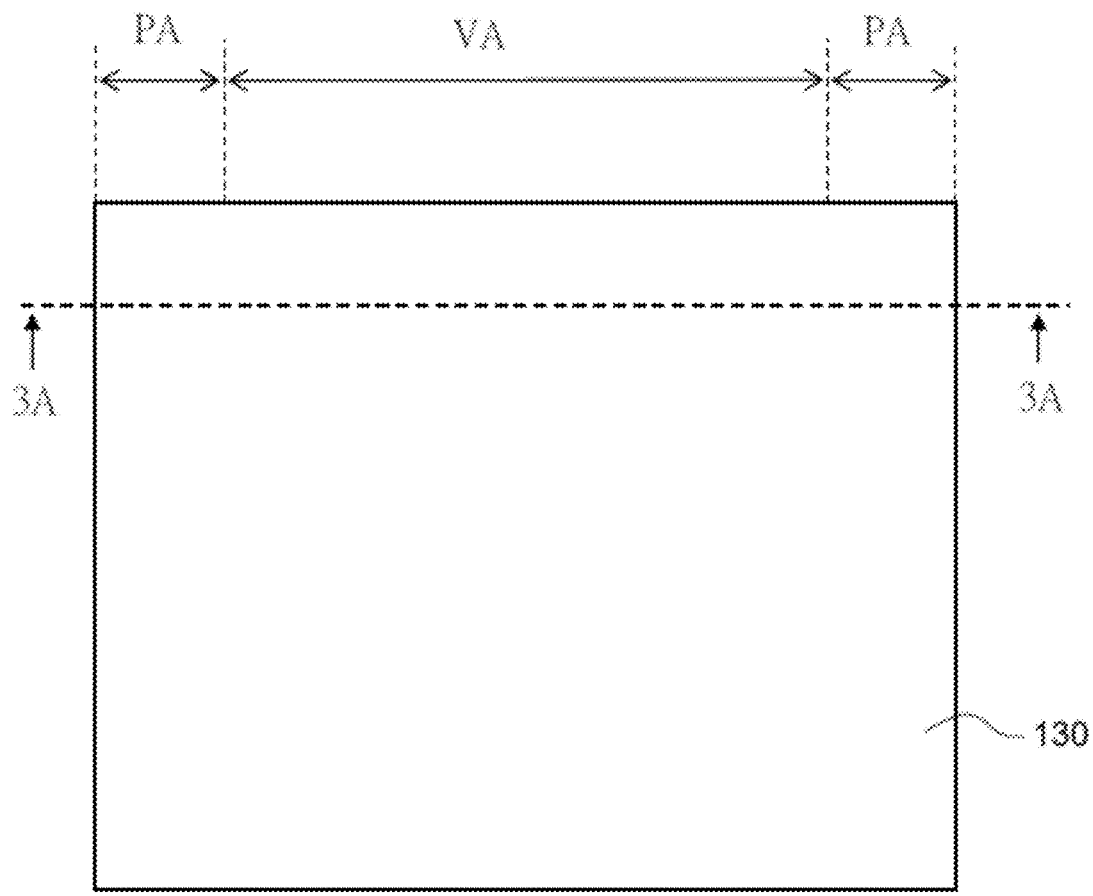
FIG. 3 depicts a top view schematic diagram at step S1 of the manufacturing method in FIG. 1.
Figure 3A:
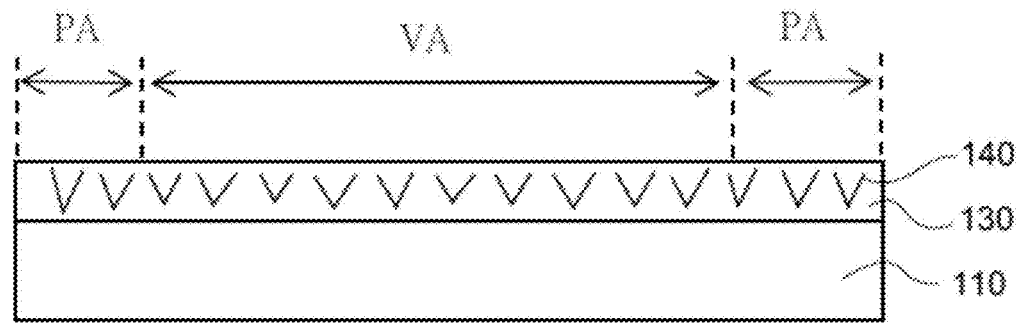
FIG. 3A depicts a cross-sectional schematic diagram taken along line 3A-3A of FIG. 3.

Then, referring to FIG. 3 and FIG. 3A, step S1 of forming a transparent conductive layer on the substrate 110 is shown. The transparent conductive layer may be formed at least by metal nanowires 140. In the present embodiment, the transparent conductive layer is a composite structure formed by the metal nanowires 140 and a film layer 130. An exemplary method for fabricating the transparent conductive layer may include the following steps. First, a dispersion or an ink having the metal nanowires 140 is formed on an entire upper surface of the substrate 110 by a coating method, and is dried to allow the metal nanowires 140 to cover the upper surface of the substrate 110. In other words, the dispersion or ink having metal nanowires 140 are cured to form a metal nanowire layer disposed in a display area VA and a peripheral area PA predefined on the substrate 110. In the emobodiments, the substrate 110 may have at least one display area VA and at least one peripheral area PA, and the peripheral area PA may be disposed on the side of the display area VA. For example, the peripheral area PA is disposed on a left side and a right side of the display area VA, as shown in FIG. 3. However, in other embodiments, the peripheral area PA may be a frame-shaped area disposed in a periphery of (that is, including the right side, the left side, an upper side, and a lower side) the display area VA, or an L-shaped area disposed on two adjacent sides of the display area VA.

According to some embodiments of the present disclosure, the above dispersion may be water, alcohol, ketone, ether, hydrocarbon, or an aromatic solvent (benzene, toluene, xylene, etc.). The above dispersion may further include an additive, a surfactant, or a binder, such as carboxymethyl cellulose (CMC), hydroxyethyl cellulose (HEC), hydroxypropyl methylcellulose (HPMC), sulfonic acid ester, sulfuric acid ester, disulfonate, sulfosuccinate, phosphate ester, or a fluorosurfactant, etc. The metal nanowire layer may be, for example, constituted by a silver nanowire layer, a gold nanowire layer, or a copper nanowire layer. In greater detail, "metal nanowires" as used herein is a collective term, which refers to a collection comprising metal wires made of a plurality of metallic elements, metal alloys, or metal compounds (including metal oxides). The number of the metal nanowires contained in the device does not affect the scope of protection claimed by the present disclosure, and at least one cross-sectional dimension of a single metal nanowire (that is, a cross-sectional diameter) is less than 500 nm, preferably less than 100 nm, and more preferably less than 50 nm. The so-called "wire" metallic nanostructure of the present disclosure mainly has a high aspect ratio, for example, between 10 and 100,000. In greater detail, an aspect ratio of the metal nanowires (i.e., the ratio of length of the nano-wire to diameter of cross section of the nanowire) may be greater than 10, preferably greater than 50, and more preferably greater than 100. The metal nanowires may be any metal including (but not limited to) silver, gold, copper, nickel, and gold-plated silver. Other terms, such as silk, fiber, tube, etc., if similarly having the above dimensions and high aspect ratios, are also within the scope of the present disclosure.

The dispersion or ink containing the metal nanowires 140 may be formed on the surface of the substrate 110 by any method, such as but not limited to processes like screen printing, nozzle coating, roller coating, etc. In some embodiments of the present disclosure, the metal nanowires 140 may be silver nanowires or silver nanofibers, which may have an average diameter of about 20 to 100 nanometers and an average length of about 20 to 100 micrometers, preferably an average diameter of about 20 to 70 nanometers and an average length of about 20 to 70 micrometers (that is, an aspect ratio is 1000). In some embodiments, a diameter of the metal nanowires 140 may be between 70 and 80 nanometers and a length is about 8 micrometers.

Figure 4:
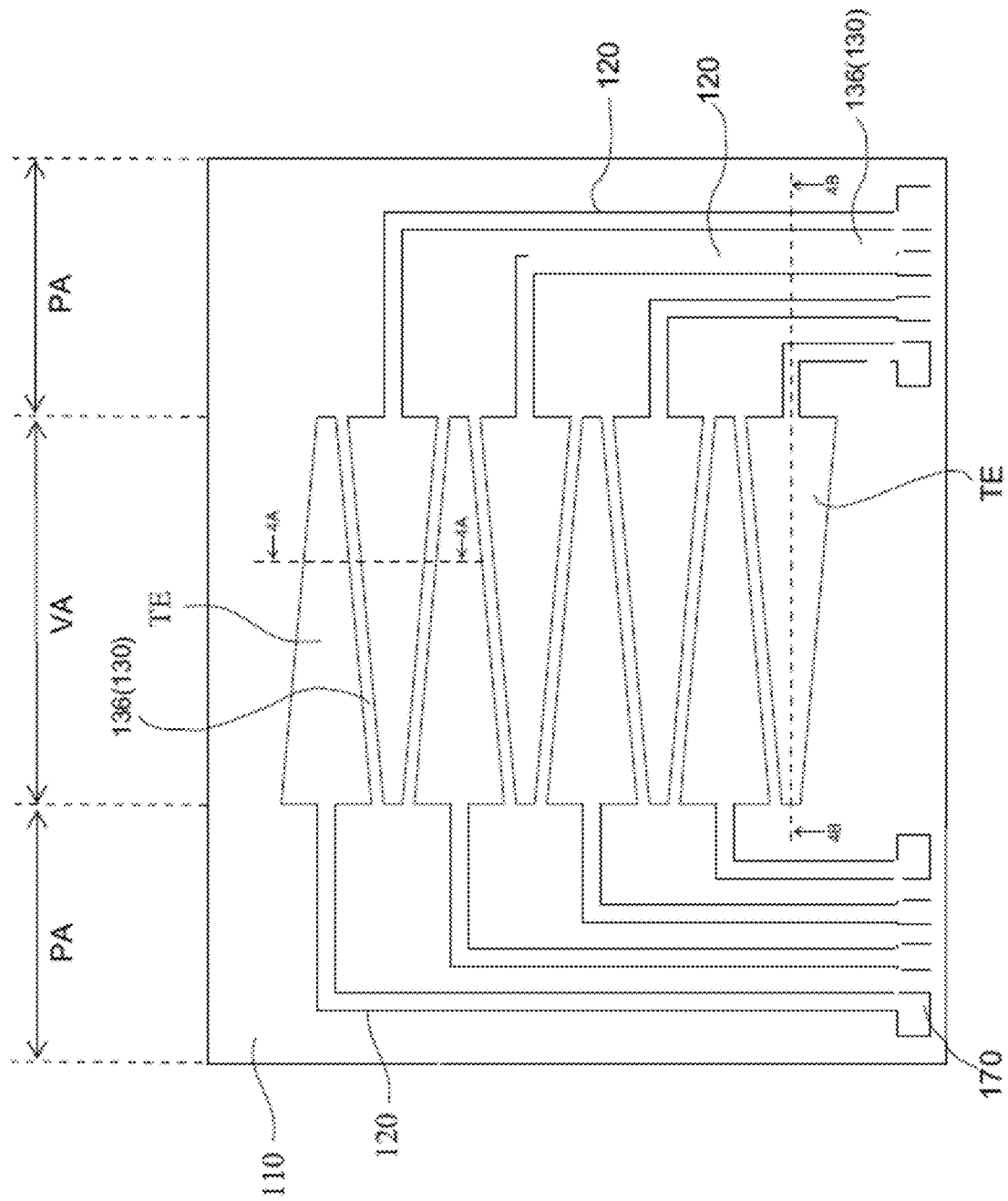
FIG. 4 depicts a top view schematic diagram at step S2 of the manufacturing method in FIG. 1.

Next, a suitable polymer or its precursor is formed on the substrate 110 by a coating method. The polymer/precursor will penetrate the space between the metal nanowires 140 to form a filler, and a step of curing the polymer/precursor is performed to form the film layer 130. In other words, the film layer 130 will be cured and formed in the display area VA and the peripheral area PA on the substrate 110, so that the film layer 130 and the metal nanowires 140 integrally form a composite structure. The metal nanowires 140 can form a conductive network in the film layer 130; that is, the so-called transparent conductive layer, which has metal nanowires 140 and the film layer 130 is formed. Through the subsequent steps, the composite structure forms touch sensing electrodes TE in the display area VA and peripheral conductive traces 120 in the peripheral area PA (as shown in FIG. 4), and the touch sensing electrodes TE are electrically connected to the peripheral conductive traces 120.

An example of the above polymer may include but is not limited to an acrylic resin, such as polymethacrylate (e.g., poly(methyl methacrylate)), polyacrylate and polyacrylonitrile; polyvinyl alcohol, polyester (e.g., polyethylene terephthalate (PET), polyester naphthalate, and polycarbonate); a polymer having a high degree of aromaticity, such as a phenolic resin or cresol-formaldehyde, polystyrene, polyvinyltoluene, polyvinylxylene, polyimide, polyamide, polyamideimide, polyetherimide, polysulfide, polysulfone, polyphenylene, and polyphenyl ether; polyurethane (PU); epoxy; polyolefin (e.g. polypropylene, polymethylpentene, and cyclic olefin); cellulose; silicone and other silicon-containing polymers (e.g. polysilsesquioxane and polysilane); polyvinylchloride (PVC); polyacetate ester; polynorbornene; a synthetic rubber (e.g. ethylene-propylene rubber (EPR), styrene-butadiene rubber (SBR), or ethylene-propylene-diene monomer (EPDM)); and a fluoropolymer (e.g., polyvinylidene fluoride, polytetrafluoroethylene (TFE) or polyhexafluoropropylene); a non-conductive polymer such as a copolymer of fluoro-olefin and hydrocarbon olefin. In other embodiments, an inorganic material such as silicon dioxide, mullite, alumina, SiC, carbon fiber, $MgO-Al_2O_3-SiO_2$, $Al_2O_3-SiO_2$ or $MgO-Al_2O_3-SiO_2-Li_2O$ may also be used as the film layer 130. In addition, since part of the composite structure formed by the metal nanowires 140 and the film layer 130 will be etched in the subsequent processes to form the touch sensing electrodes in the display area VA, the composite structure formed by the metal nanowires 140 and the film layer 130 may have a light transmittance of more than about 80% and a surface resistance of about 10 to 1000Ω/☐ (ohm/square) in the present embodiment. Preferably, the composite structure formed by the metal nanowires 140 and the film layer 130 has a light transmittance of more than about 85% and a surface resistance of about 50 to 500Ω/□ (ohm/square).

In addition, it is noted that the step of forming the polymer on the substrate 110 by the coating method is not limited to being performed after the step of curing the dispersion or ink containing the metal nanowires 140. For example, the dispersion containing the metal nanowires 140 and the above polymer may be sequentially coated on the substrate 110 and then be cured together in a curing step. In some embodiments, a polymeric material of the film layer 130 is a kind of fluid, such as a transparent colloid, so that it can be intermixed with the ink that contains the metal nanowires 140. As a result, the metal nanowires 140 are directly mixed in the polymer. After the coating and curing steps, the metal nanowires 140 are embedded into the film layer 130. In some embodiments, a solvent contained in the ink containing the metal nanowires 140 can interact with the film layer 130 (e.g., the film layer 130 is dissolved or softened by the solvent, this process step is called swelling), and the metal nanowires 140 can thus penetrate into the film layer 130. Therefore, the above process sequence can be adjusted as follows. The film layer 130 is first formed. Then, the ink containing the metal nanowires 140 is coated on the film layer 130 to allow the film layer 130 to be dissolved or softened. As a result, the metal nanowires 140 can penetrate into the dissolved or softened film layer 130 so as to form the composite structure of the film layer 130 and the metal nanowires 140.

In addition, the above polymer after being cured may achieve certain chemical, mechanical, and optical properties in the composite structure constituted by the film layer 130 and the metal nanowires 140. For example, the adhesion strength between the composite structure and the substrate 110 is provided or improved, or, a higher physical and mechanical strength is provided. The film layer 130 may also be called a matrix. In yet another aspect, the use of certain specific polymers for the film layer 130 provides the composite structure with surface-protection effects, for example, additional scratch-resistance and abrasion-resistance. Under the circumstances, the film layer 130 may also be called a hard coat. The use of polyacrylate, epoxy, polyurethane, polysilane, silicone, poly (silicon-acrylic acid), and the like allows the composite structure to have a higher surface strength so as to improve the scratch resistance of the composite structure. In addition, a cross-linking agent, a polymerization inhibitor, a stabilizer (such as but not limited to, an antioxidant, a UV stabilizer), a surfactant, or the like or a mixture thereof may be added to the film layer 130 or the polymer to achieve a given function, for example, to improve the UV resistance of the composite structure or to extend the storage period. In other embodiments, the film layer 130 may further include a corrosion inhibitor. However, the above description only illustrates the possibilities of the additive composition and additional function/name of the film layer 130, and the above description is not intended to limit the present disclosure.

Preferably, process conditions (such as a deposition time) of the film layer 130 can be controlled so that the film layer 130 is thin enough (e.g., less than about 90 nm) to allow the metal nanowires 140 to protrude out of the film layer 130 so that the metal nanowires 140 may be exposed from a surface of the film layer 130. It is noted that, in order to make the illustration clear, the metal nanowires 140 are embedded into the film layer 130 without being exposed in the cross-sectional views of drawings of the present disclosure.

Preferably, post-processing may be performed on the metal nanowires 140. The post-processing may include a process of heat, plasma, corona discharge, UV ozone, pressure or some combination thereof to increase electrical conductivity of the metal nanowires 140. For example, after the curing step for forming a layer of the metal nanowires 140, a roller can be utilized to apply a pressure to the layer of the metal nanowires 140. In one embodiment, one or more rollers may be utilized to apply a pressure of about 50 to 3400 psi, preferably a pressure of about 100 to 1000 psi, a pressure of about 200 to 800 psi, or a pressure of about 300 to 500 psi to the layer of the metal nanowires 140. In some embodiments, a post-process of applying pressure and heat can be performed. In greater detail, the metal nanowires 140 that have been formed can be pressurized through the above one or more rollers and heated at the same time. For example, a pressure of about 10 to 500 psi, preferably about 40 to 100 psi, is applied by one or more rollers, and at the same time the rollers are heated to a temperature between about 70° C. and 200° C., preferably between about 100° C. and 175° C. for heating the metal nanowires 140. In this manner, the conductivity of the metal nanowires 140 and/or the composited coating layer can be increased. In some embodiments, the metal nanowires 140 may be preferably exposed to a reducing agent for a post-treatment process. For example, the metal nanowires 140 constituted by silver nanowires may be preferably exposed to a silver reducing agent for a post-treatment process. The silver reducing agent includes, but is not limited to, a borohydride, such as sodium borohydride, a boron nitride, such as dimethylamine borane (DMAB), or a gaseous reducing agent, such as hydrogen (H2). The exposure time is about 10 seconds to about 30 minutes, preferably about 1 minute to about 10 minutes. Depending on practical needs, the step of applying pressure as mentioned above may be performed before or after the step of coating the film layer 130.

Figure 4A:
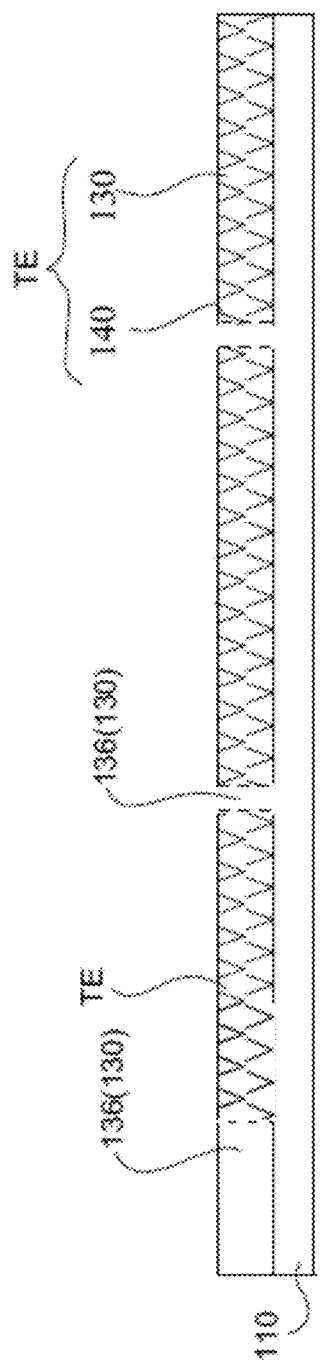
FIG. 4A depicts a cross-sectional schematic diagram taken along line 4A-4A of FIG. 4.
Figure 4B:
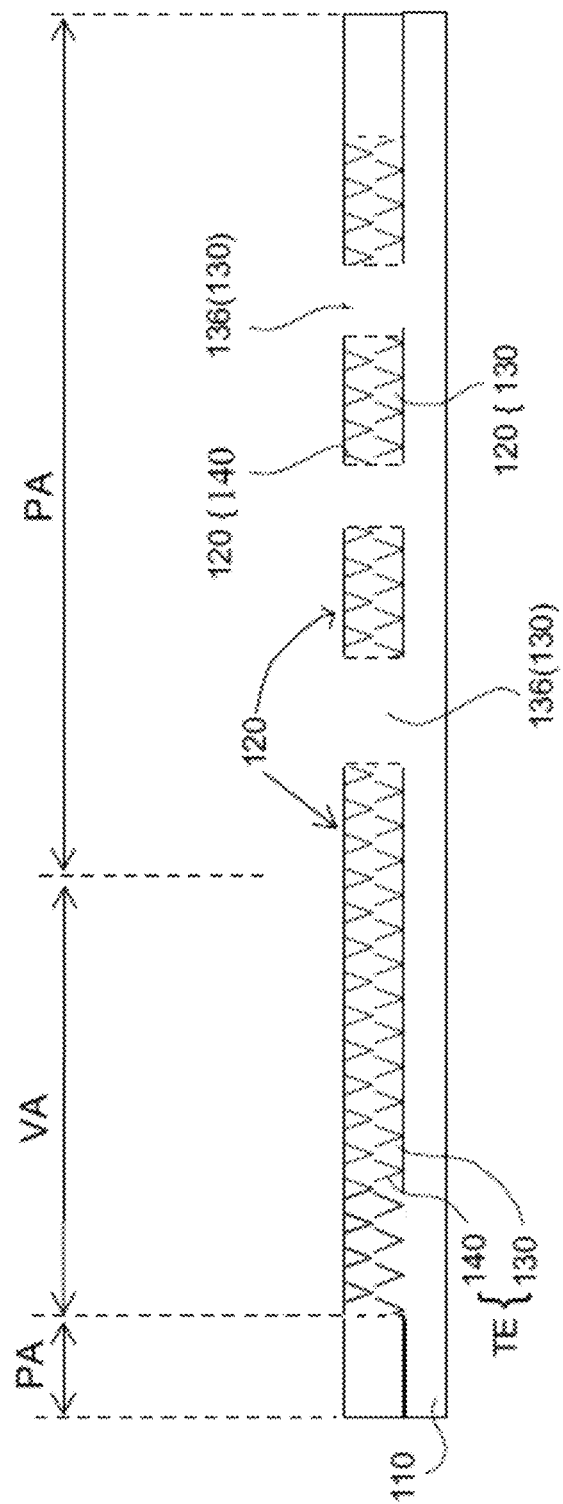
FIG. 4B depicts a cross-sectional schematic diagram taken along line 4B-4B of FIG. 4.

Referring to FIG. 4 and FIG. 4B, step S2 of patterning the transparent conductive layer (e.g., the composite layer formed by the film layer 130 and the metal nanowires 140) is shown. For example, an etching process is utilized to pattern the transparent conductive layer. In greater detail, a patterned photomask (not shown) may be used above the transparent conductive layer to pattern the transparent conductive layer. The patterned photomask has a first patterned photomask area corresponding to the peripheral area PA and a second patterned photomask area corresponding to the display area VA. A pattern of the first patterned photomask area is used for defining a pattern of one or more peripheral conductive traces 120, which are subsequently formed in the peripheral area PA. A pattern of the second patterned photomask area is used for defining a pattern of one or more touch sensing electrodes TE, which are subsequently formed in the display area VA. In greater detail, by using the patterned photomask as a shield mask, the metal nanowires 140 in the transparent conductive layer which are not shielded by the patterned photomask are etched so as to form the one or more peripheral conductive traces 120 and the one or more touch sensing electrodes TE. In the above etching step, as shown in FIG. 4A, the transparent conductive layer in the display area VA will be etched by an etchant so as to define a pattern of the touch sensing electrodes TE and a pattern of a non-conductive area 136 based on the pattern of the second patterned photomask area. At the same time, as shown in FIG. 4B, the transparent conductive layer in the peripheral area PA will be etched by the etchant so as to define a pattern of the peripheral conductive traces 120 and a pattern of the non-conductive area 136 based on the pattern of the first patterned photomask area. For example, phosphoric acid/hydrochloric acid may be selected as the etchant to pattern the metal nanowires 140 constituted by the silver nanowires. Alternatively, in other embodiments, a nitric acid, a phosphoric acid, a hydrochloric acid, mixtures thereof, or some other suitable materials may also be used as the etchant. In this manner, the metal nanowires 140 in parts of the transparent conductive layer not shielded by the patterned photomask are removed by the etchant to form the non-conductive area 136, i.e., the area of composite layer may be considered non-conductive if it has a sheet resistance of higher than $10^8 \Omega/\square$ (ohm/square), preferably higher than $10^4 \Omega/\square$ (ohm/square), 3000Ω/□ (ohm/square), 1000Ω/□ (ohm/square) or 350Ω/□ (ohm/square), or 100Ω/□ (ohm/square). On the other hand, the transparent conductive layer shielded by the patterned photomask can form the peripheral conductive traces 120 (in the peripheral area PA) and the touch sensing electrodes TE (in the display area VA) with a high electrical conductivity. In short, this step removes portions of the metal nanowires 140 to form the non-conductive area 136 in both the display area VA and the peripheral area PA, and the remaining composited layer of the metal nanowires 140 and the film layer 130 forms the peripheral conductive traces 120 (in the peripheral area PA) and the touch sensing electrodes TE (in the display area VA). In some embodiments, the film layer 130 is not removed by the eachant and is retained in the non-conductive area 136 in the process of etching the metal nanowires 140.

In greater detail, an etchant or a solvent may permeate into the film layer 130 so as to remove the metal nanowires 140, where metal nanowires 140 are not shielded by the patterned photomask. For example, an over-etch step (also called a full etch process) is performed to completely remove the metal nanowires 140 in the transparent conductive layer not shielded by the patterned photomask. In other words, there are no metal nanowires 140 remaining in the transparent conductive layer not shielded by the patterned photomask (that is, the concentration of the metal nanowires 140 is zero) after etching, and only the film layer 130 is left in the transparent conductive layer not shielded by the patterned photomask to define an insulation area, e.g., the non-conductive area 136. It can be seen from the above step that in the display area VA, the touch sensing electrodes TE are constructed by the transparent conductive layer (e.g., the composite layer integrally formed by the film layer 130 and the metal nanowires 140) that is not etched, and the area which does not provide for electrical transmission function (e.g., an area having no touch sensing electrode TE formed thereon or the non-conductive area 136 between adjacent touch sensing electrodes TE) is made of the remaining film layer 130 after the etching step for removing the metal nanowires 140. Similarly, in the peripheral area PA, the peripheral conductive traces 120 are constructed by the transparent conductive layer that is not etched, and the area which does not provide for electrical transmission function (e.g., the area having no peripheral conductive trace 120 formed thereon or the non-conductive area 136 between the adjacent peripheral conductive traces 120) is made of the remaining film layer 130 after the etching step for removing the metal nanowires 140. Additionally, some of film layer 130 remains between adjacent electrodes/traces, i.e., the touch sensing electrodes TE or the peripheral conductive traces 120, such that the polymer used for fabricating the film layer 130 is preferably a non-conductive polymer in the present embodiment.

Figure 5:
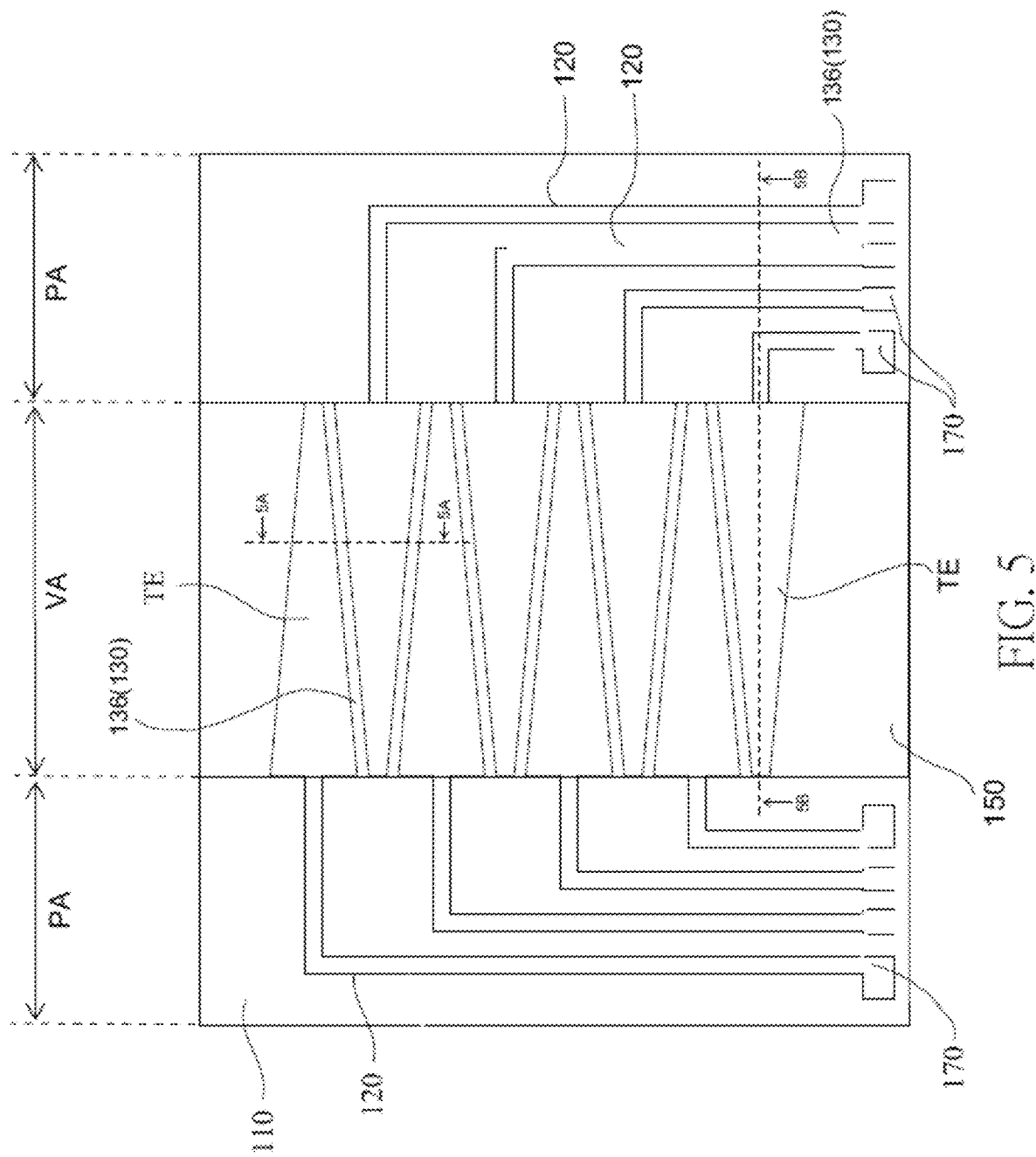
FIG. 5 depicts a top view schematic diagram at step S3 of the manufacturing method in FIG. 1.
Figure 5A:
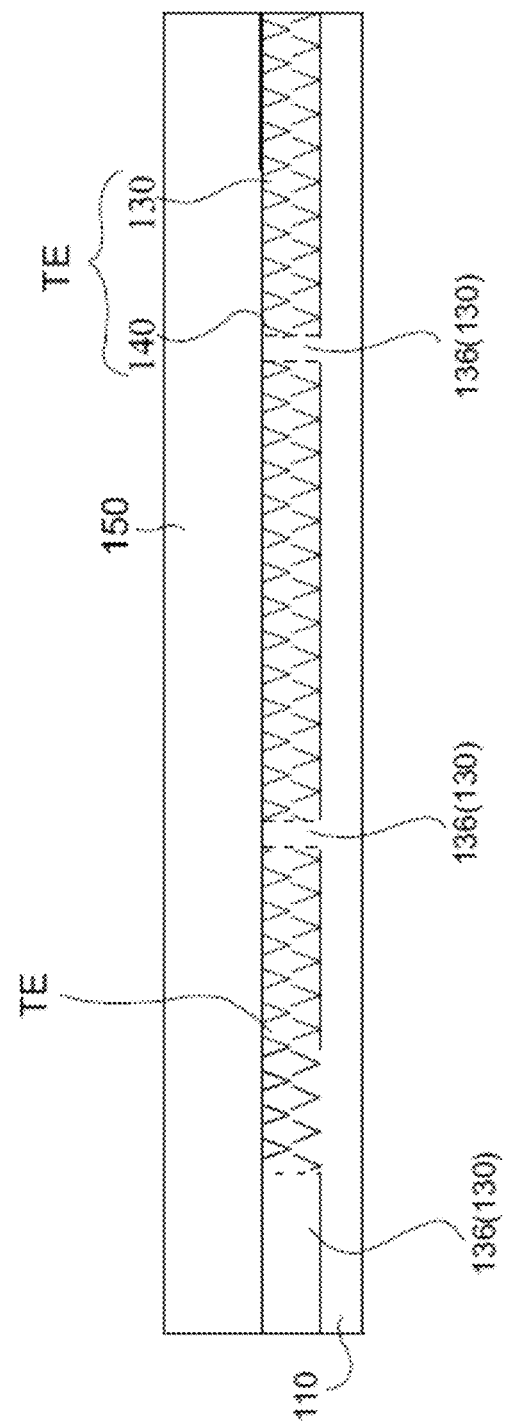
FIG. 5A depicts a cross-sectional schematic diagram taken along line 5A-5A of FIG. 5.
Figure 5B:
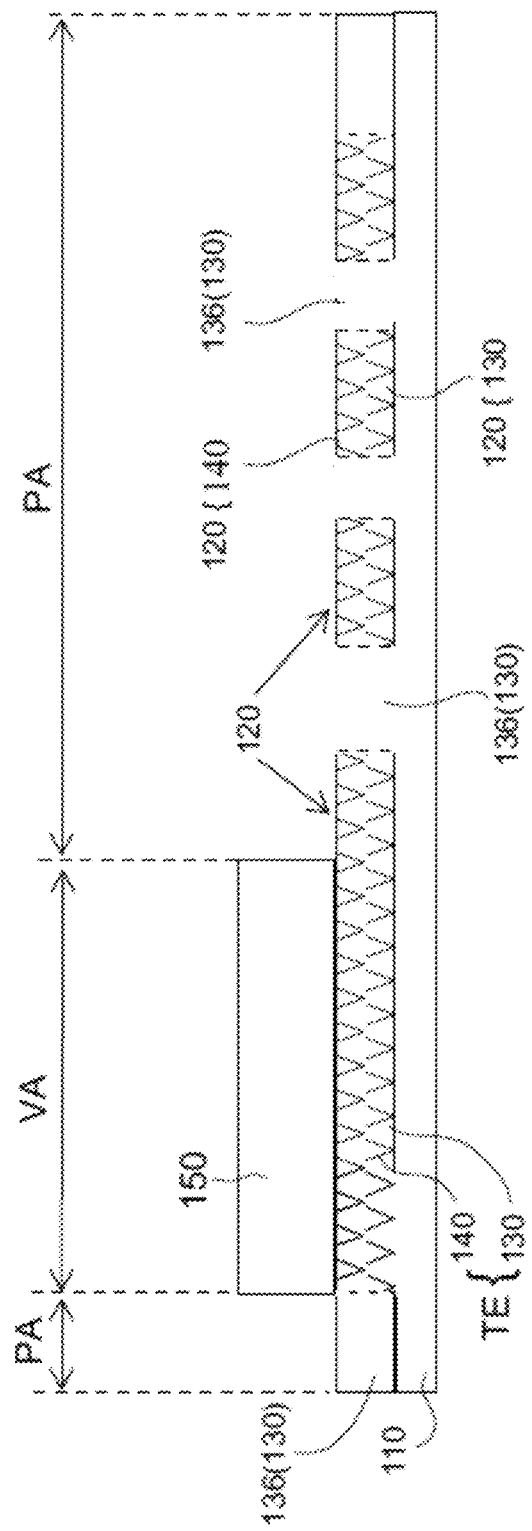
FIG. 5B depicts a cross-sectional schematic diagram taken along line 5B-5B of FIG. 5.

Referring to FIG. 5 and FIG. 5B, step S3 includes forming a protective layer 150 on the touch sensing electrodes TE. In one embodiment, the protective layer 150 is substantially disposed in the display area VA so that the protective layer 150 covers the touch sensing electrodes TE and the remaining film layer 130 after etching in the display area VA (as shown in FIG. 5A and FIG. 5B). The protective layer 150 may prevent the touch sensing electrodes TE from being affected by the subsequent electroless plating/plating process. Additionally, the protective layer 150 improves the durability of the product. For example, the protective layer 150 is shown in the end product and is provided for reducing the oxidation of the metal nanowires 140 so as to increase the life of product.

The material of the protective layer 150 may be the same polymer as that of the film layer 130, and an appropriate material may be selected depending on practical needs. Preferably, the protective layer 150 may be made of a transparent material having anti-acid, anti-alkali, and anti-scratch properties. In another embodiment, the material of the protective layer 150 may be different from that of the film layer 130. For example, a photoresist material (such as a dry film material) is attached to the display area VA to protect the touch sensing electrodes TE from being affected by subsequent processes. No matter what the material of the protective layer 150 is, the protective layer 150 may be removed as required by the product, for example, a removing process is performed to remove the protective layer 150 after a subsequent process for a conductive layer 160 is completed.

Figure 6:
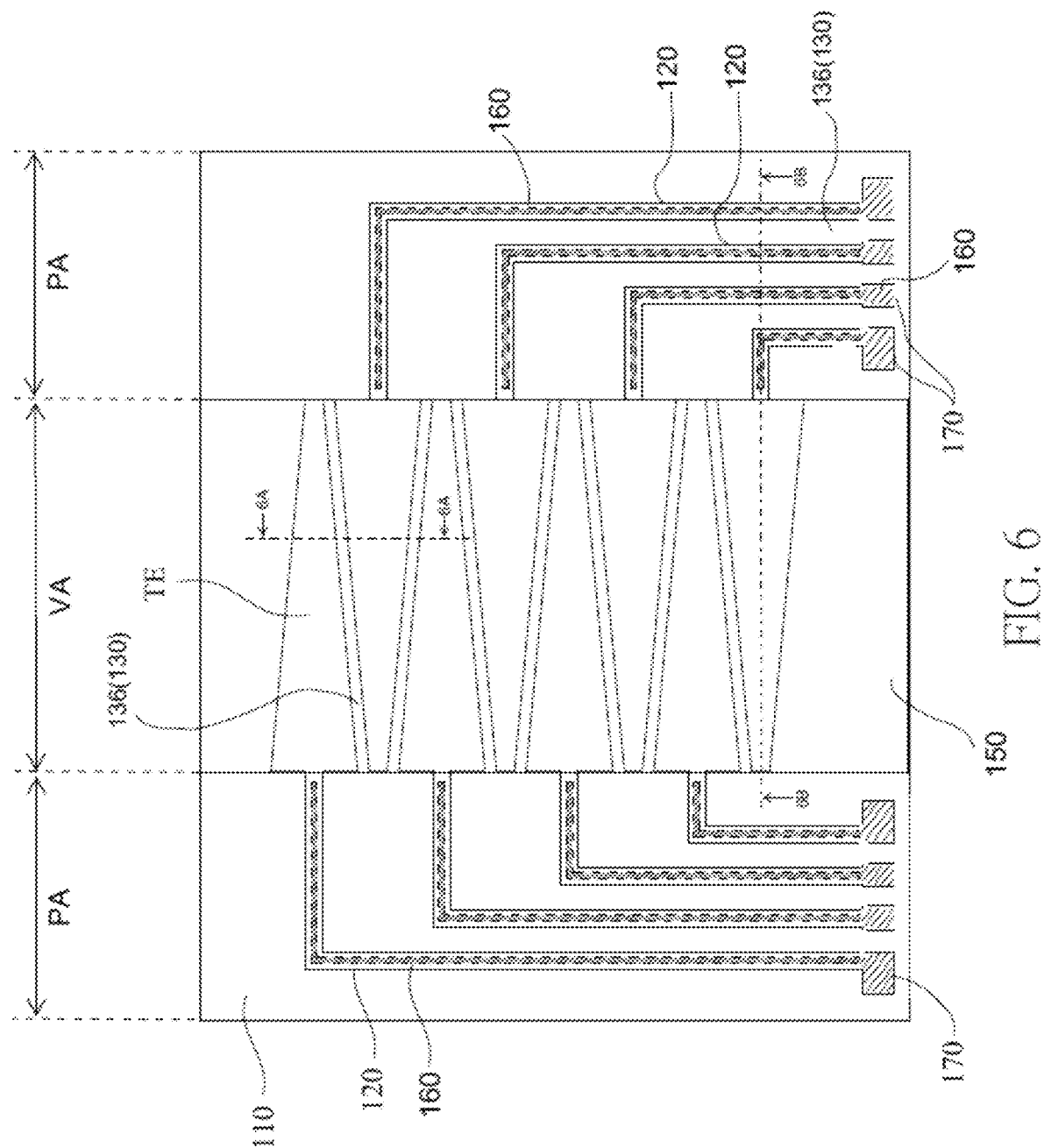
FIG. 6 depicts a top view schematic diagram at step S4 of the manufacturing method in FIG. 1.
Figure 6A:
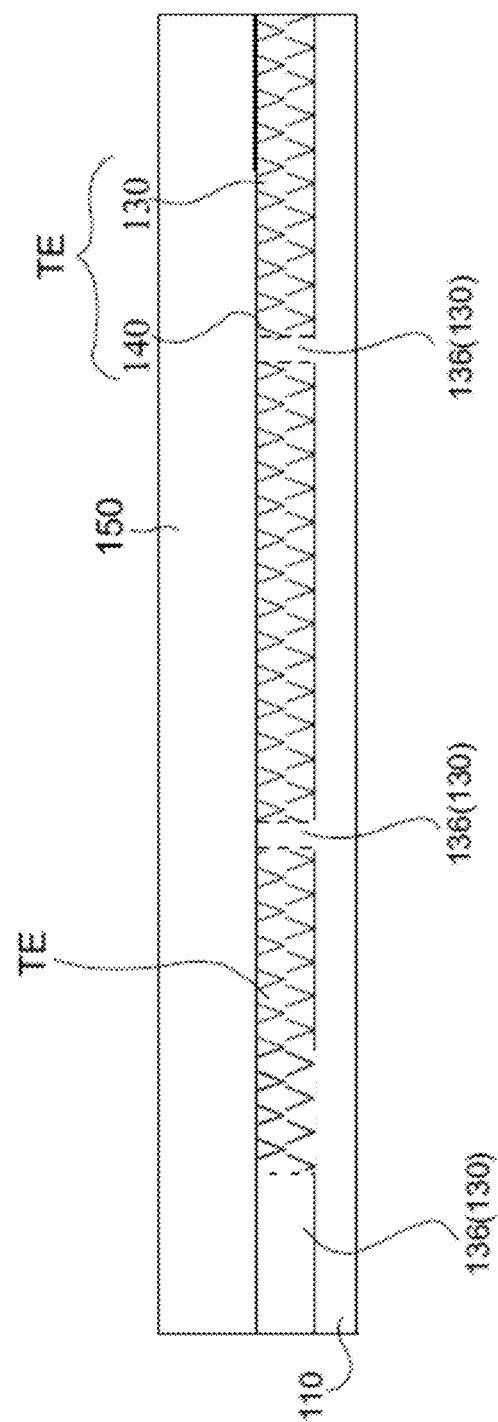
FIG. 6A depicts a cross-sectional schematic diagram taken along line 6A-6A of FIG. 6.
Figure 6B:
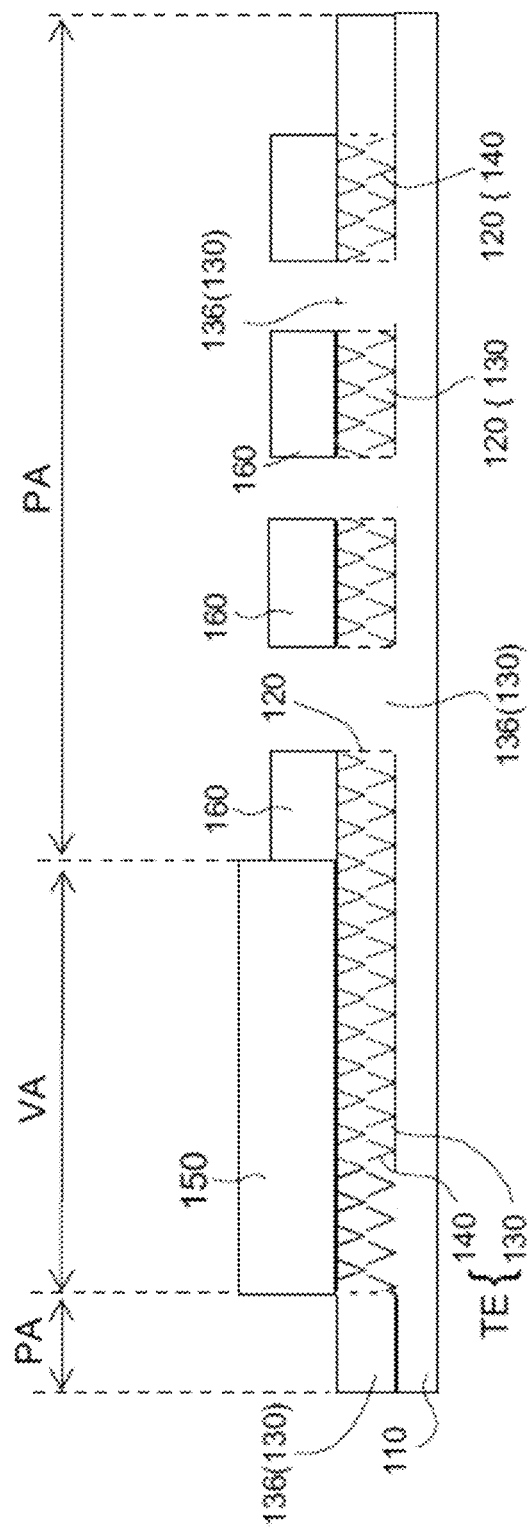
FIG. 6B depicts a cross-sectional schematic diagram taken along line 6B-6B of FIG. 6.

Then, referring to FIG. 6, FIG. 6A, and FIG. 6B, step S4 is performed for forming the conductive layer 160 on the composite structure (i.e., the peripheral conductive traces 120 made by the integral film layer 130 and the metal nanowires 140) in the peripheral area PA. The conductive layer 160 can form a signal transmission circuit/line having a low impedance. In other words, the conductive layer 160 can be used to increase the conductivity of the peripheral conductive traces 120. The conductive layer 160 may be fabricated by using an electro-plating, an electroless plating, or a combination thereof. In one embodiment, the conductive layer 160 is fabricated by an electroless plating. That is, metal ions in the plating solution are reduced to metal under the catalytic action of a metal catalyst by means of a suitable reducing agent in the absence of an applied electrical current. and then a metal flim/layer is formed on a surface of a conductive object. This process is called electroless plating, and also called chemical plating or autocatalytic plating. Therefore, the conductive layer 160 according to the present embodiment may also be called an electroless plating layer, a chemical plating layer or an autocatalytic plating layer. It is also shown in FIG. 6A that the protective layer 150 is coated on the display area VA, so that the touch sensing electrodes TE in the display area VA will not be affected by the electroless plating solution. Please refer to FIG. 6A and FIG. 6B, showing the conductive layer 160 is formed on the peripheral conductive traces 120 and is not formed on the non-conductive area 136 in the peripheral area PA.

It is noted that, in order to make the illustration clear, a width of the conductive layer 160 in FIG. 6 is slightly less than a width of the peripheral conductive traces 120. However, the present disclosure is not limited thereby. In other words, the width of the conductive layer 160 may be greater than, less than, or equal to the width of the peripheral conductive traces 120 by adjusting the parameters of the electroless plating process.

Figure 9A:
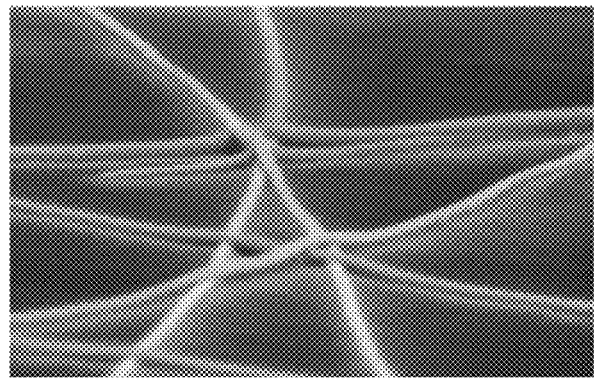
FIG. 9A shows an SEM image of peripheral conductive traces (silver nanowires are exposed).
Figure 9B:
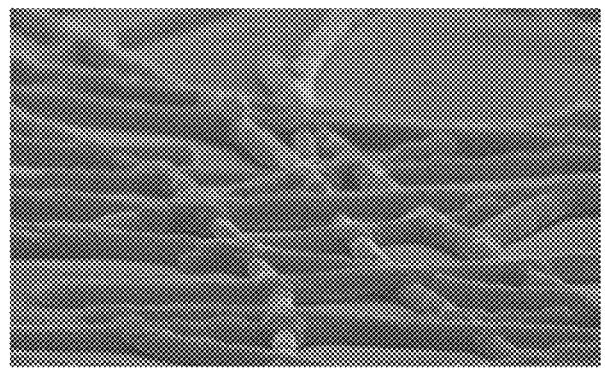
FIG. 9B shows an SEM image of an electroless-plating copper layer coated on peripheral conductive traces.

In one embodiment, the conductive layer 160 may be a single-layered structure, such as an electroless-plating copper layer. FIG. 9A shows an SEM image of the peripheral conductive traces 120. FIG. 9B shows an SEM image of an electroless-plating copper layer coated on the peripheral conductive traces 120. In another embodiment, the conductive layer 160 may be a multi-layered stackup, for example, a double-layered stackup, which may include an electroless-plating copper layer and an electroless-plating nickel layer. In greater detail, a semi-finished product (e.g., the substrate 110, the patterned composite structure, and the protective layer 150) is immersed in a first electroless plating solution, for example, a plating solution containing copper sulfate as a main component. A composition of the first electroless plating solution may be but is not limited to: copper sulfate having a concentration of about 5 g/L, ethylenediaminetetraacetic acid having a concentration of about 12 g/L, and formaldehyde having a concentration of about 5 g/L. The pH of the electroless copper plating solution is adjusted to about 11 to 13 by using sodium hydroxide. The plating bath temperature is about 50 to 70° C., and the reaction time of plating is about 1 to 5 minutes. During the electroless plating reaction, the copper material can nucleate on the catalytically active metal nanowires 140 (such as silver nanowires), and then continues to grow so as to form a copper film or layer by means of the self-catalysis of copper. In other words, owing to the conductive and catalytic properties provided by the metal nanowires 140 in the peripheral conductive traces 120 in the peripheral area PA, the electroless plating process for copper can be directly performed on the peripheral conductive traces 120 without the use of an additional activation layer. After that, the panel having an electroless-plating copper layer is immersed in a second electroless plating solution, for example, a plating solution containing nickel sulfate as a main component. A composition of the second electroless plating solution may be but is not limited to: nickel sulfate having a concentration of about 35 g/L, ammonium chloride (NH4Cl) having a concentration of about 50 g/L, citric acid having a concentration of about 50 g/L, and sodium hypophosphite having a concentration of about 15 g/L. The pH of the electroless plating solution is adjusted to about 8 to 10 by using ammonium hydroxide. The bath temperature is about 40 to 60° C., and the reaction time is about 10 to 60 seconds. Similarly, electroless-plating of nickel is performed to form an electroless-plating nickel layer covering the electroless-plating copper layer. In the double-layered conductive layer 160, the electroless-plating copper layer increases the conductivity of the peripheral conductive traces 120, and the electroless-plating nickel layer improves the anti-oxidation ability and chemical corrosion resistance of the peripheral conductive traces 120 and the electroless copper layer. In another embodiment, the conductive layer 160 may be a multi-layered stackup, for example, a triple-layered stackup, which may include an electroless-plating copper layer, an electroless-plating nickel layer, and an electroless-plating palladium (Pd) layer.

In another embodiment, a thickening step may be added in the processes to increase the thickness of the conductive layer 160. For example, an electro-plating process may be performed to increase the thickness of the conductive layer 160 of an electroless-plating copper layer. A composition of the electro-plating solution for electro-plating a copper layer may be but is not limited to: copper sulfate having a concentration of about 200 g/L, sulfuric acid having a concentration of about 80 g/L, and chloride ions having a concentration of about 50 mg/L. The pH is adjusted to about 3 to 5. The applied current density is about 1 A/dm2 to about 10 A/dm2. The bath temperature is about 25° C. to about 45° C. The sequence of the above electroless plating process and plating process may be adjusted depending on practical needs and is not limited. For example, conductive layer 160 includes sequentially formed layers, which are an electro-plating copper layer, an electroless-plating copper layer, and an electroless-plating nickel layer. In other embodiments, the thickening step may be another electroless plating process. For example, a second electroless-plating copper process is performed by using a plating solution having a composition different from that of the above-mentioned electroless plating solution of copper, i.e., the first electroless plating solution to increase the thickness of the conductive layer 160.

In another embodiment, the conductive layer 160 may be an electro-plating layer, electroless-plating layer or a combination thereof having a core-shell structure of any two or more metals, such as but not limited to Cu core-Ni shell, Cu core-Mo shell, Cu core-Pd shell, Cu core-Ni/Pd shell, or Ag core-Cu/Ni shell. For example, an electroless-plating copper chemical reaction bath, as described above, may be first performed to deposit the electroless-plating copper layer, then sodium borohydride (NaBH4, 98%) is mixed with ethylene glycol to serve as a reducing agent. Nickel ions (for example, nickel chloride ($NiCl_2 \cdot 6H_2O$) is added to the above solution) are reduced to nickel metal, and the nickel metal is deposited on the copper layer to form Cu core-Ni shell structures in a heterogeneous nucleation. In another embodiment, the conductive layer 160 may be an electro-plating layer having a core-shell structure of a composite material, for example, a composite conductive particle of a micrometer-sized polymer material (such as polystyrene)/silver.

In one embodiment, the core-shell structures may be formed on the metal nanowires 140 to partially or completely encapsulate the metal nanowires 140. The core-shell structure may be in any shape. For example, a cross section of the core-shell structure may be a circle, a hexagon, or the like.

In one embodiment, by using the electroless-plating copper layer, a sheet resistance of the peripheral conductive traces 120 made of silver nanowires can be reduced from 60Ω/□ (ohm/square) to 0.1Ω/□ (ohm/square).

At this point, the manufacturing of the touch panel according to the present embodiment has been completed. The touch sensing electrodes TE in the display area VA can be used for sensing a touch position or a gesture of a user. The peripheral conductive traces 120 in the peripheral area PA are electrically connected to the touch sensing electrodes TE so as to transfer sensing signals detected by the touch sensing electrodes TE to an external controller (not shown in the figure). The conductive layer 160 is disposed on the peripheral conductive traces 120 for reducing a signal transmission impedance of the touch panel according to the present embodiment to achieve better electrical signal characteristics. In addition, the protective layer 150 is disposed on the touch sensing electrodes TE in the display area VA. Hence, the touch sensing electrodes TE in the display area VA are not affected by the electroless/electro plating solution. In other words, the physical properties of the touch sensing electrodes TE in the display area VA, such as light transmittance, haze, conductivity and the like, are not affected by the electroless/electro plating step(s). The protective layer 150 can also improve the strength of the touch sensing electrodes TE, and/or the anti-acid property, anti-alkali property, or the like of the touch panel according to the present embodiment. Therefore, the touch panel has a better durability. In another embodiment, the protective layer 150 may be removed.

In one embodiment, the peripheral conductive traces 120 further have bonding pads 170. The conductive layer 160 is similarly disposed on the bonding pads 170, as shown in FIG. 6. Hence, when a step of connecting an external circuit board, such as a flexible circuit board, to the touch panel (e.g., a bonding step) is subsequently performed, the conductive layer 160 on the bonding pads 170 can be directly soldered with pads on the flexible circuit board to form a transmission path. In another embodiment, some other soldering auxiliary layer (not shown in the figure) may be formed on the conductive layer 160 on the bonding pads 170, then a bonding step, such as soldering or the like is performed with the flexible circuit board. The composite structure of the conductive layer 160 and the peripheral conductive traces 120 thus forms a low impedance signal transmission path, which is used for transmitting control signals (i.e., driving signals) and touch sensing signals between the touch sensing electrodes TE and the above external controller. Owing to its low impedance characteristic along the signal transmission path, reduction of signal transmission losses is achieved.

The touch panel according to the present embodiment is a touch panel with single-sided/non-crossing electrodes. In detail, the touch sensing electrodes TE are a single-layered configuration, and the touch sensing electrodes TE are arranged in a crisscross pattern of lines and columns. The processing method of the present disclosure may be applied to touch panels having various other structures.

In addition, a pre-processing step may be further included to preferably expose the metal nanowires 140 from the surface of the film layer 130 for manufacturing the peripheral conductive traces 120 in the peripheral area PA. For example, a plasma treatment may be utilized. In other words, portions of the film layer 130 of the peripheral conductive traces 120 are removed by plasma so as to expose the metal nanowires 140. In greater detail, argon (Ar) plasma is utilized to treat the film layer 130. Parameters for the argon plasma may be: power: 200-400 W, gas flow rate: 50-100 ml/min, gas pressure: 10-50 Pa, processing time: 60~120 sec. The above pre-processing step may be performed before or after the step of forming the protective layer 150. In one embodiment, the plasma treatment is performed after the step of forming the protective layer 150. In the treatment period, the peripheral area PA and the display area VA may simultaneously be treated with plasma. Portions of the film layer 130 in the peripheral area PA are removed by the plasma to expose the metal nanowires 140, and portions of the protective layer 150 in the display area VA are also removed by the plasma to thin down the protective layer 150. However, the film layer 130 and the metal nanowires 140 underneath the protective layer 150 are preferably protected from the plasma treatment.

Figure 7A:
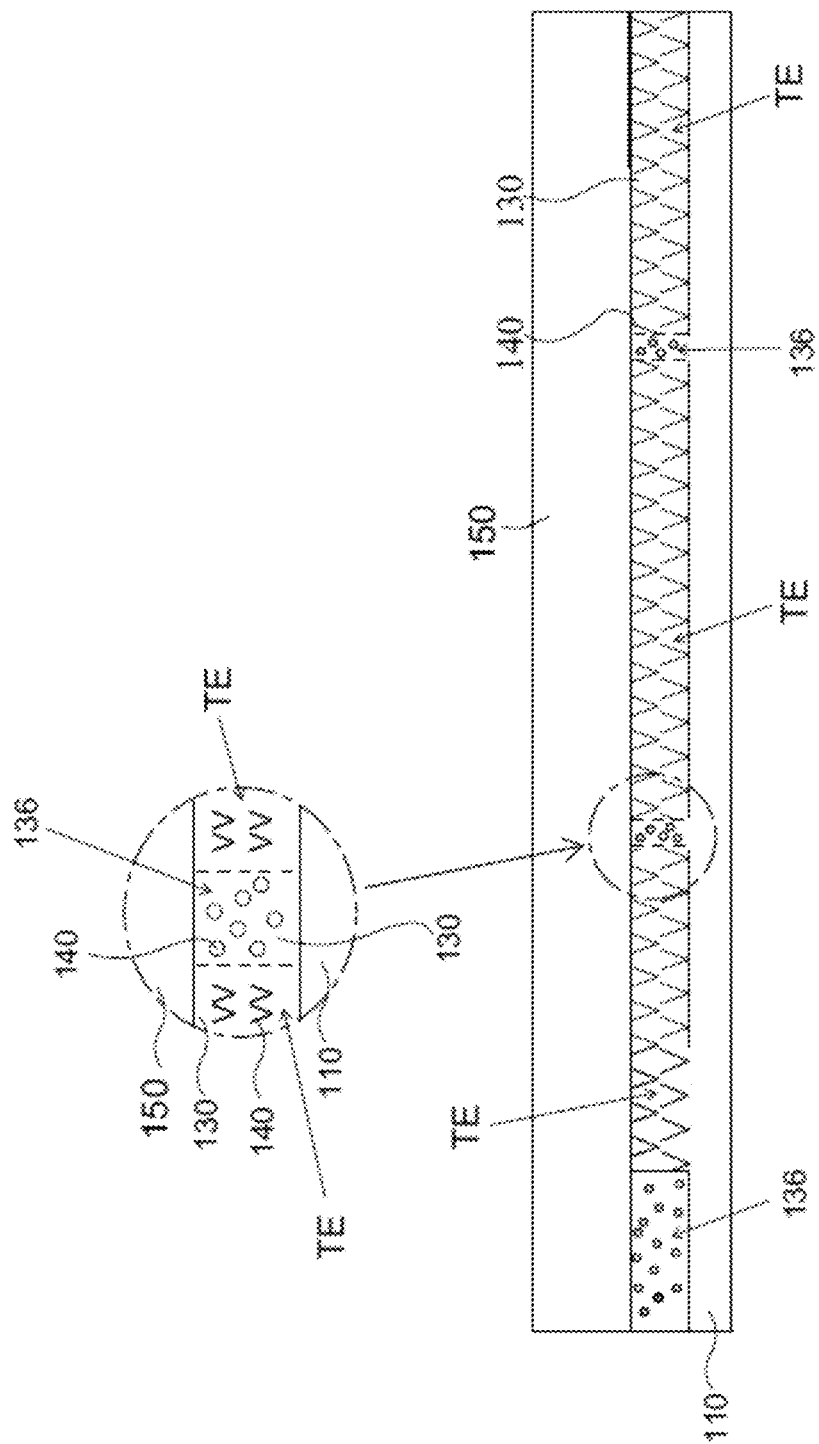
FIG. 7A depicts a modification of the structure of the embodiment in FIG. 6A.
Figure 7B:
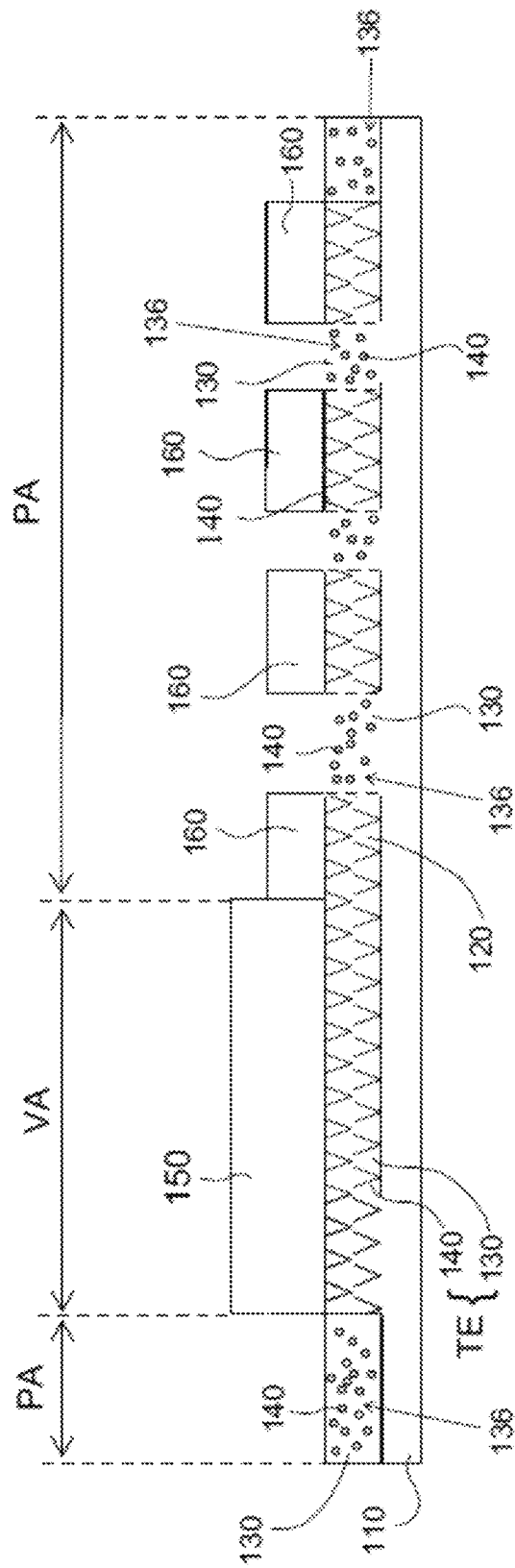
FIG. 7B depicts a modification of the structure of the embodiment in FIG. 6B.

FIG. 7A and FIG. 7B show another embodiment of the above touch panel. FIG. 7A shows a modification of the structure of the embodiment in FIG. 6A. FIG. 7B shows a modification of the structure of the embodiment in FIG. 6B. The difference between the present embodiments and that of FIGS. 6A-6B is mainly and at least that: In the present embodiment, metal nanowires 140 distribute in the non-conductive area 136 in either the display area VA or the peripheral area PA. However, the concentration of the metal nanowires 140 in the film layer 130 located in the non-conductive area 136 is lower than a percolation threshold such that the metal nanowires 140 do not form a conductive network. Generally speaking, the conductivity of the composite structure constituted by the film layer 130 and the metal nanowires 140 is mainly controlled at least by the following factors: (a) electrical conductivity of single nanowire 140; (b) the number of the metal nanowires 140; and (c) connectivity (also called contact ability) between the metal nanowires 140. If the concentration of the metal nanowires 140 is lower than the percolation threshold, the metal nanowires 140 are spaced too far apart to contact with each other, and the composite structures of the film layer 130 and the metal nanowires 140 may not have enough electrical conductivity. That is, the metal nanowires 140 do not provide a continuous electrical current path so that a conductive network can not be formed. In other words, metal nanowires 140 in the non-conductive area 136 form a non-conductive network. Above this concentration (i.e., percolation threshold), there is at least one current path available. In an embodiment, the area of composite layer or a structure may be considered non-conductive if it has a sheet resistance of higher than $10^8 \Omega/\square$ (ohm/square), preferably higher than $10^4 \Omega/\square$ (ohm/square), $3000 \Omega/\square$ (ohm/square), $1000 \Omega/\square$ (ohm/square) or $350 \Omega/\square$ (ohm/square), or $100 \Omega/\square$ (ohm/square).

As shown in FIG. 7A, the metal nanowires 140 in the non-conductive area 136 in the display area VA have a concentration lower than the percolation threshold, and the protective layer 150 covers both the non-conductive area 136 (i.e., an area in which the metal nanowires 140 have a concentration lower than the percolation threshold) and the touch sensing electrodes TE (i.e., an area in which the metal nanowires 140 have a concentration higher than the percolation threshold). As shown in FIG. 7B, the metal nanowires 140 in the non-conductive area 136 in the peripheral area PA have the concentration lower than the percolation threshold, and the conductive layer 160 covers the peripheral conductive traces 120 (e.g., the conductive area in which the metal nanowires 140 have the concentration higher than the percolation threshold). The non-conductive area 136 (e.g., the area in which the metal nanowires 140 have the concentration lower than the percolation threshold) is exposed from the conductive layer 160. It is noted that the nanowires 140 having a low concentration of metal are filled in the non-conductive area 136 to allow the non-conductive area 136 and the conductive area to have more similar optical characteristics. For example, the refractive indices of the non-conductive area 136 and the conductive area (such as the touch sensing electrodes TE) in the display area VA are more similar. When a user uses the touch panel to view the picture displayed by the display screen, the display performance is more consistent. In other words, it is more difficult for the user to visually perceive the boundary between the non-conductive area 136 and the conductive area.

A detailed method for forming the non-conductive area 136 having the metal nanowires with the concentration lower than the percolation threshold may be as follows but not limited to: controlling etching parameters during the patterning step at step S2. For example, the etching time is shortened or the etchant concentration is reduced to perform a partial etch. As a result, some metal nanowires 140 are not removed in the patterning step and the remaining metal nanowires 140 in the film layer 130 in the non-conductive area 136 have the concentration lower than the percolation threshold. It is noted that different symbols are used in FIG. 7A and FIG. 7B to represent the metal nanowires 140 having different concentrations, where "V" represents the metal nanowires 140 having the concentration higher than the percolation threshold, and "O" represents the metal nanowires 140 having the concentration lower than the percolation threshold.

Figure 8:
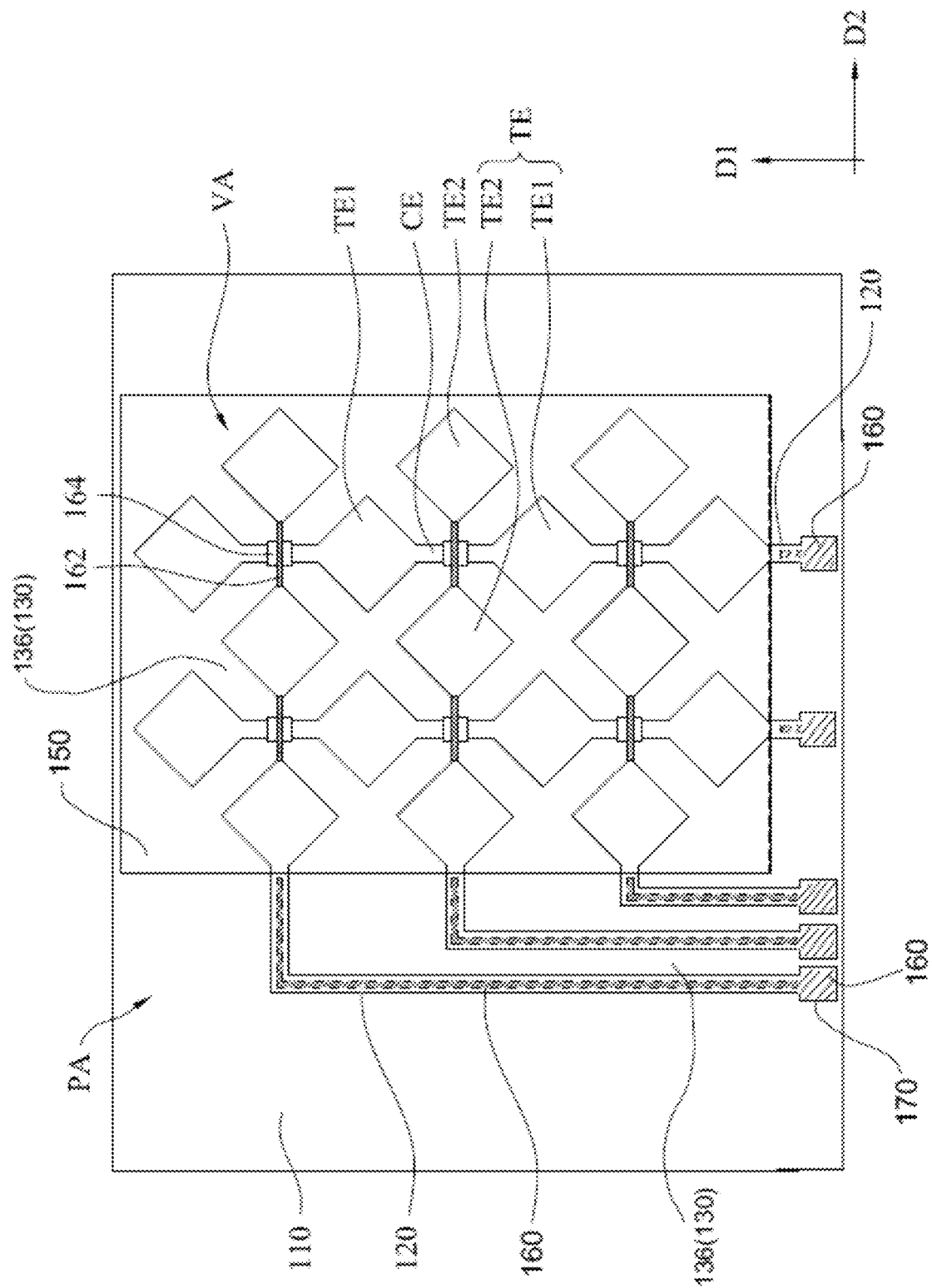
FIG. 8 depicts a top view schematic diagram of a touch panel according to some embodiments of the present disclosure.

FIG. 8 shows another embodiment of a touch panel according to this disclosure. The touch panel is a single-sided bridge touch panel. The differences between the present embodiment and the above embodiments are as follows. The step of patterning the transparent conductive layer (that is, the composite structure formed by the film layer 130 and the metal nanowires 140) formed on the substrate 110 comprises: etching the transparent conductive layer in the display area VA to form the first touch sensing electrodes TE1 arranged in a first direction D1, the second touch sensing electrodes TE2 arranged in a second direction D2, and connecting electrodes CE electrically connecting two adjacent first touch sensing electrodes TE1, and etching the transparent conductive layer in the peripheral area PA to form the peripheral conductive traces 120 connecting to the first touch sensing electrodes TE1 and the second touch sensing electrodes TE2. An insulating block 164 is then formed on each of the connecting electrodes CE. For example, the insulating blocks 164 are formed of silicon dioxide. Finally, a bridge wire 162 is formed on each of the insulating blocks 164. For example, the bridge wires 162 are formed of copper, and the bridge wire 162 connects two adjacent second touch sensing electrodes TE2 in the second direction D2. The insulating block 164 is located between the connecting electrode CE and the bridge wire 162 to electrically isolate the connecting electrode CE and the bridge wire 162, so that the touch sensing electrodes in the first direction D1 and the second direction D2 are electrically isolated from each other.

Subsequently, as described in the previous embodiments, the steps of forming the protective layer 150 and the conductive layer 160 are performed. Detailed methods may refer to the above description and a description in this regard is not repeated.

The present disclosure process may also be applied to the double-layered touch panel. The touch sensing electrodes TE and the peripheral conductive traces 120 are first formed on two opposite surfaces of the substrate 110, then the above steps are performed to form the protective layers 150 on the touch sensing electrodes TE and the conductive layers 160 on the peripheral conductive traces 120 on two opposite surfaces of the substrate 110.

According to some embodiments of the present disclosure, the touch sensing electrodes in the display area and the peripheral conductive traces in the peripheral area are simultaneously formed through the step of etching the transparent conductive layer. The extra steps of depositing a metallic layer and etching the metallic layer to form peripheral metal traces in the traditional art can be omitted, thus reducing the production cost and increasing the production yield.

According to some embodiments of the present disclosure, due to the protective layer on the touch sensing electrodes in the display area, the product is able to pass a more rigorous environmental resistance test owing to the effect of the protective layer. In addition, since the touch sensing electrodes and the peripheral conductive traces of the present disclosure are formed by using the same transparent conductive layer, no traditional connection structure between the touch sensing electrode and the peripheral metal traces is necessary. As a result, even though the protective layer is used for protecting the touch sensing electrodes, the issue of the high contact resistance/impedance of the connection structure does not exist.

According to some embodiments of the present disclosure, due to the conductive layer on the peripheral conductive traces, a low impedance conductive circuit can be formed because the conductive layer has a higher conductivity than that of the transparent conductive layer. As a result, losses and distortions occurring when transmitting the touch signals are reduced.

According to some embodiments of the present disclosure, due to the conductive layer on the peripheral conductive traces, the conductive layer has an auxiliary effect of repairing the peripheral conductive traces. For example, if scratches generated in the process cause breakage of metal nanowires in the peripheral conductive traces, which in turn causes an open circuit of the circuit, the open circuit problem of the circuit can be solved because the conductive layer covers the peripheral conductive traces to allow the electric current to pass through.

According to some embodiments of the present disclosure, the durability of the touch sensing electrodes in the display area can be improved, and a low impedance conductive circuit can be formed simultaneously.

According to some embodiments of the present disclosure, the said process can simultaneously fabricate a large number of batches of single-sided or double-sided touch panels.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present invention cover modifications and variations of this invention provided they fall within the scope of the following claims and their equivalents.

What is claimed is:

1. A manufacturing method of a touch panel, comprising:
    providing a substrate, the substrate having a display area and a peripheral area;
    providing a touch sensing electrode disposed in the display area and a peripheral conductive trace disposed in the peripheral area, wherein the touch sensing electrode is electrically connected to the peripheral conductive trace, and wherein the touch sensing electrode and the peripheral conductive trace are formed by patterning a transparent conductive layer at least comprising metal nanowires;
    providing a protective layer disposed on the touch sensing electrode, wherein the protective layer is disposed only in the display area; and
    providing a conductive layer disposed on the peripheral conductive trace after providing the protective layer, wherein the conductive layer is formed by electroplating, electroless plating, or a combination thereof.

2. The manufacturing method of the touch panel according to claim 1, wherein providing the touch sensing electrode disposed in the display area and the peripheral conductive trace disposed in the peripheral area comprises:
    providing a film layer, wherein the metal nanowires are embedded into the film layer to form a conductive network, the film layer and the metal nanowires integrally form the transparent conductive layer; and
    patterning the transparent conductive layer to form a non-conductive area in the display area and the peripheral area to define the touch sensing electrode and the peripheral conductive trace.

3. The manufacturing method of the touch panel according to claim 2, wherein the metal nanowires protrude from a surface of the film layer.

4. The manufacturing method of the touch panel according to claim 2, further comprising:
exposing the metal nanowires in the peripheral conductive trace from a surface of the film layer prior to providing the protective layer.

5. The manufacturing method of the touch panel according to claim 2, wherein a material of the protective layer is the same as a material of the film layer.

6. The manufacturing method of the touch panel according to claim 2, wherein the film layer comprises a cross-linking agent, a polymerization inhibitor, an antioxidant, a ultraviolent (UV) stabilizer, a surfactant, a corrosion inhibitor, or a mixture thereof.

7. The manufacturing method of the touch panel according to claim 2, further comprising:
etching a portion of the transparent conductive layer in the peripheral area after providing the protective layer.

8. The manufacturing method of the touch panel according to claim 7, wherein etching comprises:
reducing a height of the film layer in the peripheral area, and
reducing a height of the protective layer in the display area.

9. The manufacturing method of the touch panel according to claim 1, wherein providing the conductive layer disposed on the peripheral conductive trace comprises:
performing electroless plating to form an electroless-plating copper layer on the peripheral conductive trace and an electroless-plating nickel layer on the peripheral conductive trace over the electroless-plating copper layer.

10. The manufacturing method of the touch panel according to claim 9, wherein providing the conductive layer disposed on the peripheral conductive trace further comprises:
performing electro-plating to form an electro-plating copper layer on the electroless-plating copper layer.

11. The manufacturing method of the touch panel according to claim 1, wherein providing the conductive layer disposed on the peripheral conductive trace comprises:
performing electroless plating to form an electroless-plating copper layer on the peripheral conductive trace.

12. The manufacturing method of the touch panel according to claim 1, wherein providing the conductive layer disposed on the peripheral conductive trace comprises:
performing electroless plating to form the conductive layer having a core-shell structure on the peripheral conductive trace.

13. The manufacturing method of the touch panel according to claim 1, further comprising:
removing the protective layer after providing the conductive layer.

14. The manufacturing method of the touch panel according to claim 1, wherein providing the touch sensing electrode disposed in the display area and the peripheral conductive trace disposed in the peripheral area comprises:
providing a film layer, wherein the metal nanowires are embedded into the film layer to form a conductive network, the film layer and the metal nanowires integrally form the transparent conductive layer;
masking one or more portions of the transparent conductive layer defining the touch sensing electrode and the peripheral conductive trace using a mask to define a masked portion of transparent conductive layer concealed by the mask and an unmasked portion of the transparent conductive layer not concealed by the mask; and
applying a solvent to remove at least some of the metal nanowires in the unmasked portion of the transparent conductive layer, wherein the film layer remains in the unmasked portion of the transparent conductive layer.

15. The manufacturing method of the touch panel according to claim 1, wherein an uppermost surface of the conductive layer is below an uppermost surface of the protective layer.

16. A manufacturing method of a touch panel, comprising:
providing a substrate, the substrate having a display area and a peripheral area;
providing a touch sensing electrode disposed in the display area and a peripheral conductive trace disposed in the peripheral area, wherein the touch sensing electrode is electrically connected to the peripheral conductive trace, and wherein the touch sensing electrode and the peripheral conductive trace are formed by patterning a transparent conductive layer at least comprising metal nanowires;
providing a protective layer disposed on the touch sensing electrode; and
providing a conductive layer disposed on the peripheral conductive trace after providing the protective layer, wherein:
the conductive layer is formed by electro-plating, electroless plating, or a combination thereof, and
an uppermost surface of the conductive layer is below an uppermost surface of the protective layer.

17. The manufacturing method of the touch panel according to claim 16, wherein:
the transparent conductive layer comprises a film layer and the metal nanowires are embedded into the film layer, and
the method further comprises:
performing a plasma etch to etch a portion of the transparent conductive layer in the peripheral area after providing the protective layer.

18. The manufacturing method of the touch panel according to claim 17, wherein performing the plasma etch comprises:
reducing a height of the film layer in the peripheral area, and
reducing a height of the protective layer in the display area.

19. A manufacturing method of a touch panel, comprising:
providing a substrate, the substrate having a display area and a peripheral area;
providing a touch sensing electrode disposed in the display area and a peripheral conductive trace disposed in the peripheral area, wherein the touch sensing electrode is electrically connected to the peripheral conductive trace, and wherein the touch sensing electrode and the peripheral conductive trace are formed by patterning a transparent conductive layer at least comprising metal nanowires;
providing a protective layer disposed on the touch sensing electrode; and
providing a conductive layer disposed on the peripheral conductive trace, wherein the conductive layer is formed by electro-plating, electroless plating, or a combination thereof; and
removing the protective layer after providing the conductive layer.

20. The manufacturing method of the touch panel according to claim 19, wherein the peripheral conductive trace is fully exposed after providing the protective layer.

* * * * *